United States Patent
Scheidle

(10) Patent No.: US 6,635,955 B2
(45) Date of Patent: Oct. 21, 2003

(54) MOLDED ELECTRONIC COMPONENT

(75) Inventor: Helmut Scheidle, Neuenstadt (DE)

(73) Assignee: Vishay Semiconductor GmbH, Heilbronn (DE)

(*) Notice: Subject to any disclaimer, the term of this patent is extended or adjusted under 35 U.S.C. 154(b) by 0 days.

(21) Appl. No.: 09/991,346

(22) Filed: Nov. 20, 2001

(65) Prior Publication Data

US 2002/0063320 A1 May 30, 2002

(30) Foreign Application Priority Data

Nov. 25, 2000 (DE) .......................... 100 58 622

(51) Int. Cl.[7] .............................................. H01L 23/02
(52) U.S. Cl. ...................... 257/678; 257/693; 257/694; 257/695; 257/696; 257/697
(58) Field of Search ................. 257/666, 678, 257/680, 682, 685, 686, 687, 692–697, 731, 735, 784; 438/121, 112, 124, 127, 116

(56) References Cited

U.S. PATENT DOCUMENTS

| | | | |
|---|---|---|---|
| 4,309,605 A | | 1/1982 | Okabe |
| 5,018,003 A | | 5/1991 | Yasunaga et al. |
| 5,122,893 A | | 6/1992 | Tolbert |
| 5,349,136 A | * | 9/1994 | Abe et al. .................. 174/52.2 |
| 5,350,943 A | * | 9/1994 | Angerstein et al. ......... 257/659 |
| 5,506,445 A | * | 4/1996 | Rosenberg ................. 257/666 |
| 5,640,746 A | | 6/1997 | Knecht et al. |
| 5,773,322 A | * | 6/1998 | Weld ........................... 438/117 |
| 5,841,187 A | * | 11/1998 | Sugimoto et al. .......... 257/666 |
| 6,061,160 A | * | 5/2000 | Maruyama ................. 359/152 |
| 6,157,476 A | * | 12/2000 | Angerstein et al. ......... 359/152 |
| 6,281,435 B1 | | 8/2001 | Maekawa |
| 6,294,826 B1 | * | 9/2001 | Ida et al. .................... 257/677 |
| 6,301,035 B1 | | 10/2001 | Schairer |
| 6,320,686 B1 | * | 11/2001 | Schairer ..................... 359/152 |
| 6,335,548 B1 | * | 1/2002 | Roberts et al. ............... 257/98 |
| 6,417,946 B1 | * | 7/2002 | Krieger ...................... 257/684 |

FOREIGN PATENT DOCUMENTS

| | | |
|---|---|---|
| DE | 19508284 | 1/1996 |
| DE | 19536216 | 7/1996 |
| DE | 19653054 | 7/1998 |
| DE | 19755734 | 6/1999 |
| EP | 0680086 | 11/1995 |
| JP | 55071047 | 5/1980 |
| JP | 62149174 | 7/1987 |
| JP | 63306647 | 12/1988 |
| JP | 02105448 | 4/1990 |
| JP | 02137253 | 5/1990 |
| JP | 03175658 | 7/1991 |
| JP | 05109962 | 4/1993 |

* cited by examiner

Primary Examiner—Steven Loke
Assistant Examiner—Quang Vu
(74) Attorney, Agent, or Firm—W. F. Fasse; W. G. Fasse

(57) ABSTRACT

A molded electronic component has numerous connection pins protruding on a single plane from a side surface area of an essentially cuboid housing, and a circumferential ridge of molded housing material protrudes from the other side area surfaces on the plane of the connection pins. The thickness of this ridge essentially corresponds to the thickness of the connection pins. On the side surface area located opposite the side surface area from which the connection pins protrude, in the plane of the connection pins, the ridge passes or transitions into a groove such that there is no ridge protruding outwardly beyond the side surface in this area. Thus, the component can be better placed by a tool such as a suction needle onto a printed circuit board without interference from such a ridge. The invention is particularly suitable for the production of molded electronic components whose separation plane runs through that housing surface which serves as a docking surface for a suction needle.

18 Claims, 5 Drawing Sheets

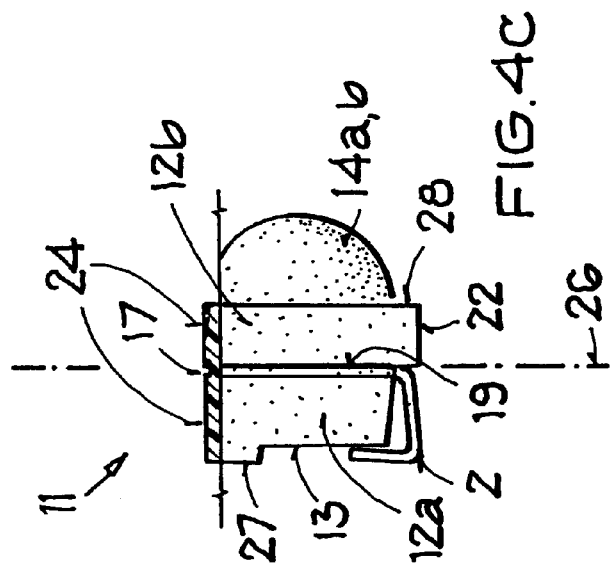
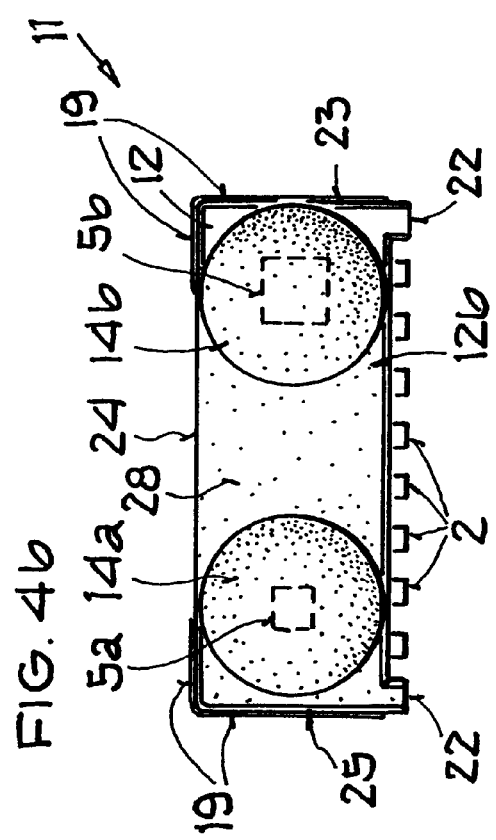

State of art

MOLDED ELECTRONIC COMPONENT

CROSS REFERENCE TO RELATED APPLICATION

This application is related to U.S. application Ser. No. 09/991,348, filed Nov. 20, 2001.

FIELD OF THE INVENTION

The invention relates to a molded electronic component with numerous connection pins protruding on a single plane from a side surface area of an essentially cuboid housing, with top and bottom sides, and a circumferential ridge along the other side area surfaces on the level of the connection pins, the thickness of which ridge essentially corresponds to the thickness of the connection pins.

BACKGROUND OF THE INVENTION

Such a molded electronic component is known, for example, from the German patent publication DE 196 53 054 A1. In the case of such molded electronic components, semiconductor chips (optoelectronic transmitter and receiver, integrated circuit for signal processing) are first glued or soldered by machine onto a metal conductor strip and then contacted to one another and with the conductor strip by means of gold or aluminum wires. Then, using a mold process, semiconductor chips and conductor strips will in most cases be enveloped by means of a thermoplastic material such as a synthetic resin, thereby creating a housing for the protection of this assembly.

When the housing is manufactured, there remains an edge or protrusion of mold material in the separation plane of the mold form, between the top and bottom sections, which edge is also designated as a "ridge". This is particularly disadvantageous if the ridge runs through a side surface of the housing which a suction needle from an automatic assembly machine will be docking onto at a later time, in order to take up the component and place the same onto a printed circuit board, for instance. Due to the ridge the suction needle does not connect tightly but draws in a great deal of external air, thus causing insufficient holding suction for any component to be taken up. In addition, when it is taken up the component will tilt over and assume a tilted and non-definable position on the suction needle. For this reason, an unacceptably large number of components are lost during transportation or are positioned imprecisely.

It is therefore attempted to keep the ridge as small as possible; however, this requires mold tools with very strict tolerances, very precise manufacturing, and additional controls. But these measures lead to significantly increased manufacturing costs without the problem having been really solved.

One possibility to avoid the ridge consists in not enveloping the electronic component with a synthetic resin by means of a mold process, but to produce a housing from a mold by encapsulation using a synthetic material suitable for casting.

However, compared to molding, the encapsulation method has many disadvantages; for example, that in comparison to molding great wall thicknesses are necessary and that these can be implemented only with relatively great tolerances and poor dimensional stability (major fluctuations) in the external dimensions. Therefore, a mold component can always be produced such that it is a more compact and space-saving product than an encapsulation component.

Furthermore, it is not possible to have a defined housing edge at the sprue side. Menisci are formed or the casting resin runs up along the connection pins of the electronic component, which will then prove to be very obstructive during the subsequent bending of the connection pins. Also, the awkward handling during the casting process is quite troublesome. Especially in the case of side view components (where the optical radiation direction is vertical to the direction of the still unbent pins), casting molds must be awkwardly and laboriously assembled for each casting process.

Another point regards cleanliness. Mixtures must be laboriously produced and the relevant level of cleanliness is difficult to maintain. In addition, defective resin mixtures are quite frequently prepared during such mixing processes. Casting molds are also quite expensive. High production costs arise additionally as cavity and, in part, sealing materials need to be used as consumables, and as a cavity change is necessary every 20 to 100 shots.

SUMMARY OF THE INVENTION

It is an object of the invention to provide a molded electronic component of the above discussed general type, which can be taken up without difficulty by an automatic assembly machine and placed on a printed circuit board.

The above object has been achieved according to the invention in a molded electronic component comprising a substantially cuboid or rectangular block-shaped housing including a top surface, a bottom surface, opposite first and second side surfaces, opposite third and fourth side surfaces, and a plurality at electrical connection pins protruding along a single pin plane from the first side surface of the housing. A mold parting ridge or flash ridge of the molded housing material protrudes along the pin plane from the third and fourth side surfaces, and this ridge passes into a groove along the pin plane on at least a portion of the second side surface of the housing opposite from the electrical connection pins.

The molded electronic component in accordance with the invention features the advantage that it can be taken up without difficulty, held securely and placed exactly, by an automatic assembly machine without particularly strict tolerances having to be maintained during the production of the molded electronic component, without any special tools having to be used for its production, and without the problematic casting process having to be used.

The invention is particularly suitable for molded electronic components whose separation plane runs through that housing surface which serves as the docking surface for the suction needle of an assembly machine.

In the following, the invention will be explained in connection with an example embodiment with reference to the drawings.

BRIEF DESCRIPTION OF THE DRAWINGS

FIGS. 4a–d: the completed molded electronic component in four different views

DESCRIPTION OF THE PREFERRED EMBODIMENTS

Figure 1:
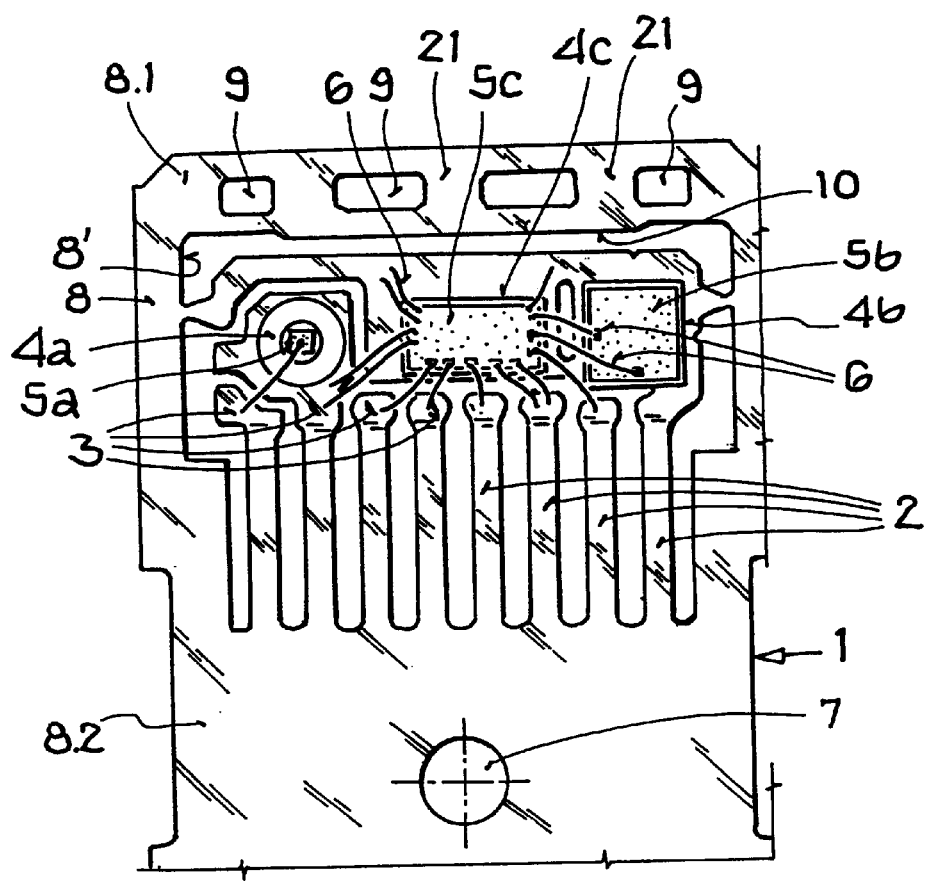
FIG. 1: a top view of an assembly consisting of a conductor strip already populated with contacted semiconductor components.

FIG. 1 shows a conductor strip 1 which, for example, consists of a copper alloy and is punched or etched out in a known fashion from thin sheet metal. Also by punching or etching, a large number of connection pins 2 with bond surfaces 3 and assembly surfaces 4a, 4b, and 4c for electronic or optoelectronic semiconductor components 5a, 5b, and 5c are formed. The semiconductor components 5a, 5b, and 5c—by means of an adhesion material such as for example a solder or a conducting adhesive—are attached material-positively to the assembly surfaces 4a, 4b, and 4c of the conductor strip 1.

The semiconductor component 5a, for example, is an optoelectronic transmitter, semiconductor component 5b, for example, is an optoelectronic receiver, and the semiconductor component 5c, for example, is an integrated circuit for processing the electric signals output by the optoelectronic receiver 5b. The semiconductor components 5a, 5b, and 5c are connected to one another, or with the bond surfaces 3 of the connection pins 2, by means of thin bond wires 6 made up of an aluminum or gold alloy.

Furthermore, the conductor strip 1 features a frame 8 with an inner boundary 8' and frame sections 8.1 and 8.2. The frame section 8.2 is provided with a positioning and transport aperture 7 in the form of a round hole, and frame section 8.1 is provided with apertures 9 in the form of longitudinal holes, with lands 21 being located between the apertures 9. In addition, frame section 8.1 features a widening 10. The meaning and purpose of the apertures 9, lands 21, and widening 10 are described below.

During the mold process, frame 8 is located between the top and bottom sections of the mold form. Its inner boundary 8' here runs around the mold form proper, as it has a slightly larger diameter than the later housing 12 (FIGS. 2a, b) produced by the mold form.

Figure 2B:
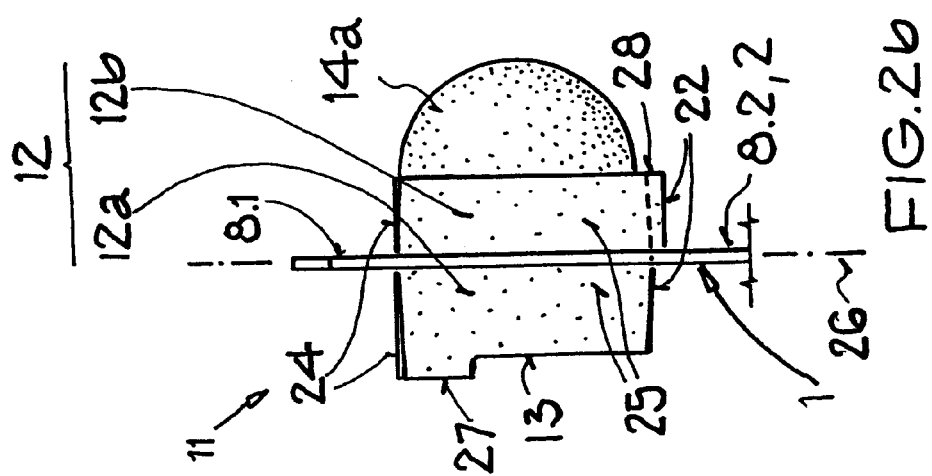
FIG. 2b: a side view onto the molded electronic component according to FIG. 2a, FIG. 3: a side view (sectional representation) onto the molded electronic component according to FIGS. 2a and 2b during a subsequent production step.
Figure 2A:
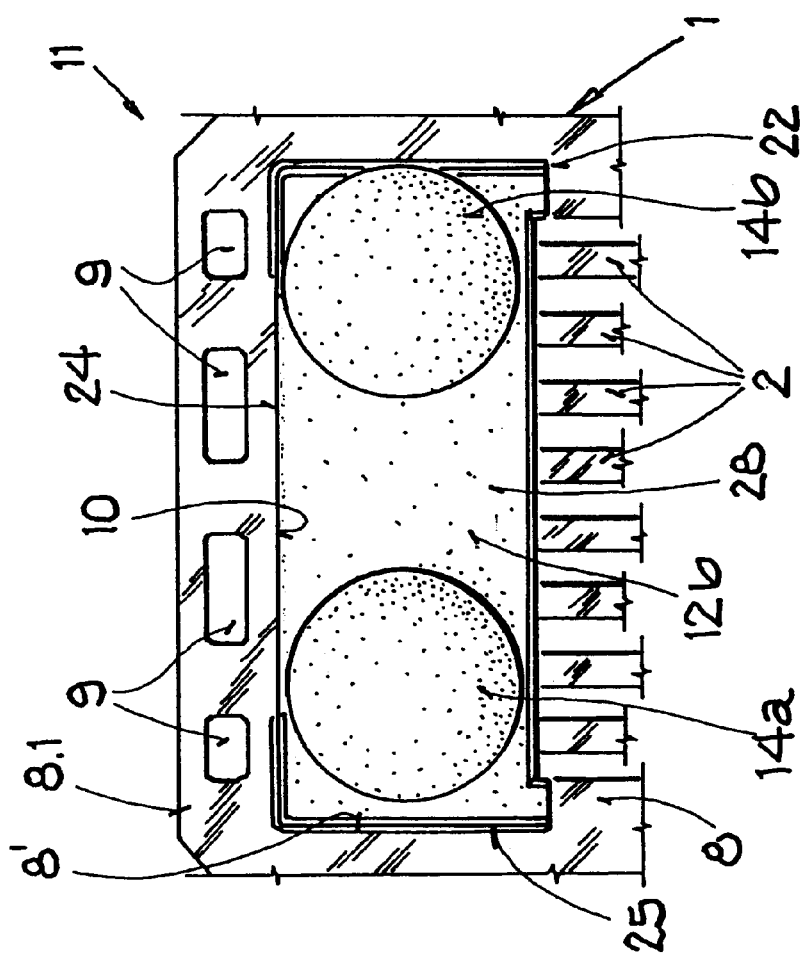
FIG. 2a: a top view of an electronic component which comprises the assembly according to FIG. 1 and is additionally provided with a molded housing.

The FIGS. 2a and 2b show an as yet uncompleted electronic component 11 consisting of the assembly shown in FIG. 1 for the directed bi-directional optical data transmission at a later stage of production. Such a component 11 is also designated as a transceiver (from Transmitter and Receiver). In order to produce a protective essentially cuboid housing 12, the semiconductor components 5a–c (FIG. 1) and the bond wires 6 (FIG. 1) were enveloped with a thermoplastic synthetic material such as a synthetic resin (transparent for a specific wavelength range) by means of a mold process.

Figure 4A:
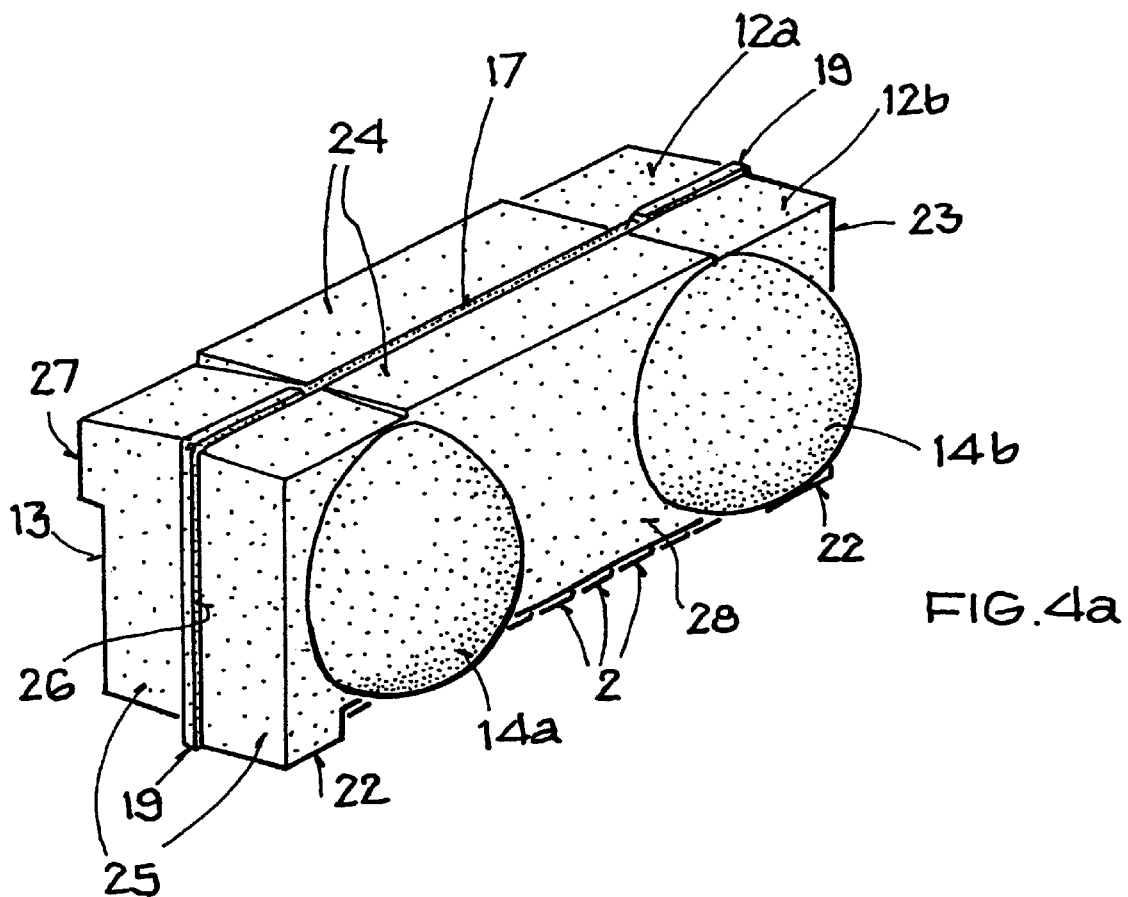
Figure 4D:
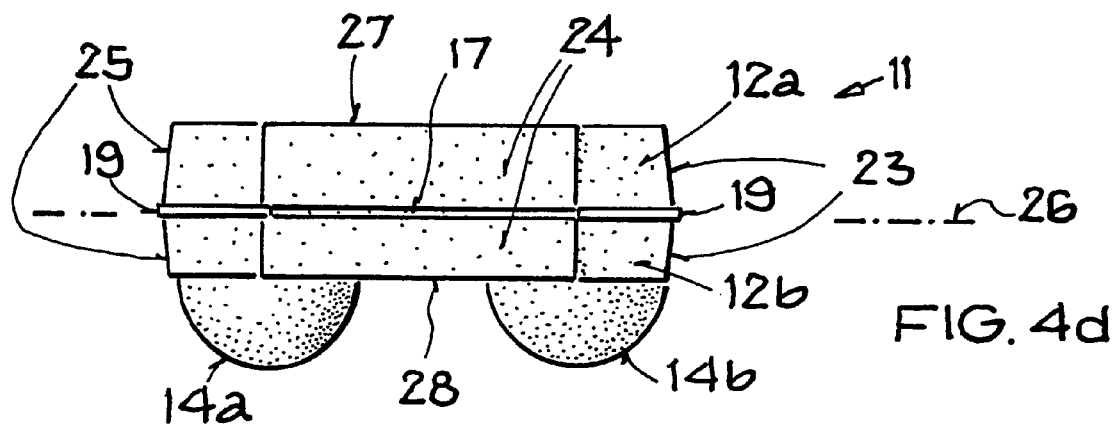

Here the housing 12 consists of two sections: a first housing section 12a with a recess 13 (into which the connection pins 2 will later protrude, FIG. 4c) and a second housing section 12b. From a plane 26 between the two housing sections 12a and 12b, in which the connection pins 2 are located, there protrude the parts of conductor strip 1 that have not yet been removed. The first housing section 12a contains the underside 27 (assembly side) of component 11 facing a printed circuit board; the second housing section 12b contains the topside 28 and two bulges 14a or 14b, which are arranged as lenses before transmitter 5a (FIG. 1) or receiver 5b (FIG. 1).

The connection pins 2 protrude from the side surface area 22 of housing 12; side surface 24 is located opposite. From the drawing plane, the further visible side surface area 25 protrudes; side surface area 23 (which cannot be seen in this view) is located opposite.

Figure 3:
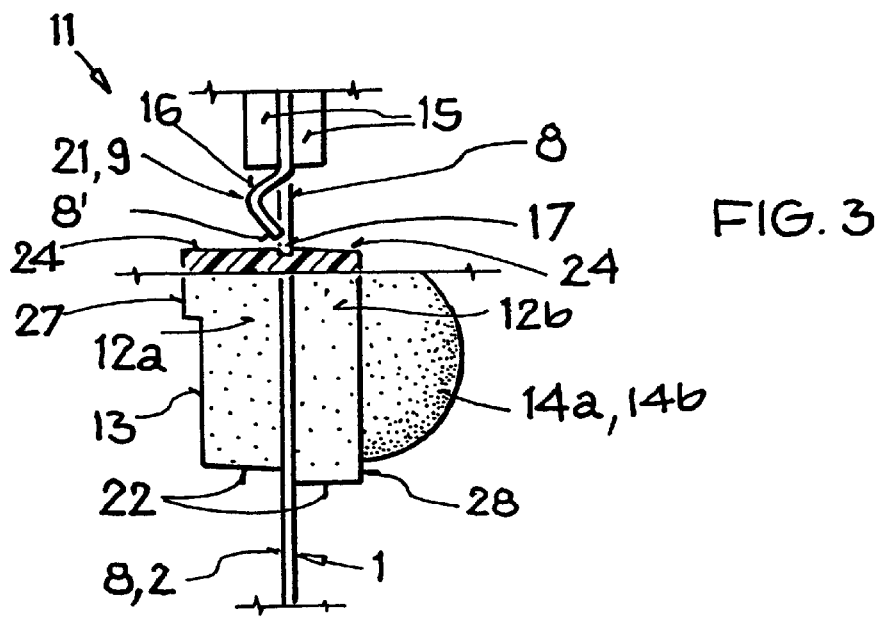

FIG. 3 shows a side view (sectional representation) of the electronic component 11 according to FIGS. 2a and 2b during a subsequent production step. Parts of conductor strip 1 that are no longer required are removed by punching or cutting, and thus, for example, the connection pins 2 are shortened to their final length.

In the case of components according to the state of the art, the frame 8 of conductor strip 1 features a distance to housing 12, which is why it is that during molding a mold material ridge 19 (FIG. 5) (synthetic resin) forms on all four side surface areas 22, 23, 24, and 25, which later can only be somewhat reduced at great effort and cost but not completely removed, thus causing major difficulties during take-up by an assembly machine.

The invention, however, provides for the frame 8—with its inner boundary 8'—to be directly adjacent to the area of the later housing 12, even protruding somewhat into the area of the later housing 12, so that, on the side surface area 24 opposite the connection pins 2, the ridge 19 will pass into a groove 17 within a connected part of side surface area 24 (as also clearly described in FIGS. 4a–d and the relevant explanations). The widening 10 of frame section 8.1 serves to prevent the formation of the ridge 19 on the side surface area 24.

In order to be able to take out component 11 from the parts of conductor strip 1 that have not yet been removed, for example by pressing out with a small lever press, without this being prevented by the widening 10 of conductor strip 1 possibly protruding into housing 12 or housing 12 being damaged thereby, the conductor strip 1 is held by means of a holding device 15 in the area of frame section 8.1, and frame section 8.1 is then re-shaped mechanically, for example by embossing, such that a deformation 16, such as shown here for example in the form of a V-shaped bead, is produced.

It is advantageous if frame section 8.1 is provided with apertures 9, for example in the form of longitudinal holes. These longitudinal holes 9 weaken the material of frame section 8.1, such that the deformation 16 can be produced at reduced force and exactly along the lands 21 between these longitudinal holes 9.

By producing the deformation 16 the frame section 8.1 is pulled away from the housing 12 (in an ideal case) or, in a case which is not ideal, drawn out from housing 12, thus creating at that point a narrow and flat groove 17. The expert with relevant training will know that, instead of the V-shaped bead shown here it is possible to produce for example a U-shaped bead or any other mechanical deformation 16 in any given fashion such that frame section 8.1 will be deformed, thus creating an intermediate space between frame section 8.1 and housing 12.

The ideal case occurs if the widening 10 of frame section 8.1 and housing 12 are still just about in contact. If, in a non-ideal case, the widening of frame section 8.1 is somewhat wider or if the housing 12 is somewhat offset during molding or produced to a somewhat larger size, then frame section 8.1 will in some small measure protrude with the widening 10 into the housing 12. When producing the deformation 16, the above-mentioned groove 17 is created in housing 12 by drawing out frame section 8.1 from the housing 12.

However, such a groove 17 only represents a minor "appearance defect" and does not have any further negative effects, as even in spite of a groove 17 a suction needle 18 will connect flush to the housing 12, and as the groove 17, which has the effect of a thin, flat channel running across the relevant surface area of housing 12, will only cause a very low volume of external air to be drawn in. This only leads to an almost unnoticeable force reduction by means of which such a component 11 is taken up by the suction needle 18. However, there will not be any tilting of component 11.

FIGS. 4*a*–*d* show the completed molded electronic component 11 in four different views. The connection pins 2 protruding from the side surface area 22 are angled twice and protrude into the recess 13. The remaining parts of conductor strip 1 arranged outside the housing 12, in particular frame 8, have been removed.

The double angling of the connection pins 2 provides two options for mounting component 11 on a printed circuit board. The first option is to mount the component 11 in side view position such that the component 11 is mounted with the side surface area 22, from which the connection pins 2 protrude, on a printed circuit board as shown here. The second option is to mount the component 11 in top view position such that the component 11 is mounted with the underside 27 on a printed circuit board.

In the plane 26, in which the connection pins 2 are also located, the ridge 19 runs around the side surface areas 22, 23, and 25. The thickness of the ridge 19 here corresponds essentially to the thickness of the connection pins 2. The ridge 19 forms because the inner boundary 8' of the frame 8 is located a distance away from the area of the later housing 12 (FIG. 2*a*). In contrast to the above, the widening 10 of frame section 8.1 now reaches close to the later housing 12 or even protrudes somewhat into the later housing 12. This measure causes ridge 19 to pass via a connected part of side surface area 24 into groove 17.

The suction needle 18 of an automatic assembly machine (not shown here) can now take up by suction component 11 on the side surface area 24 of housing 12 without any difficulty, securely hold and exactly place the same onto a printed circuit board, for example, without groove 17 having any negative effect.

Figure 5:
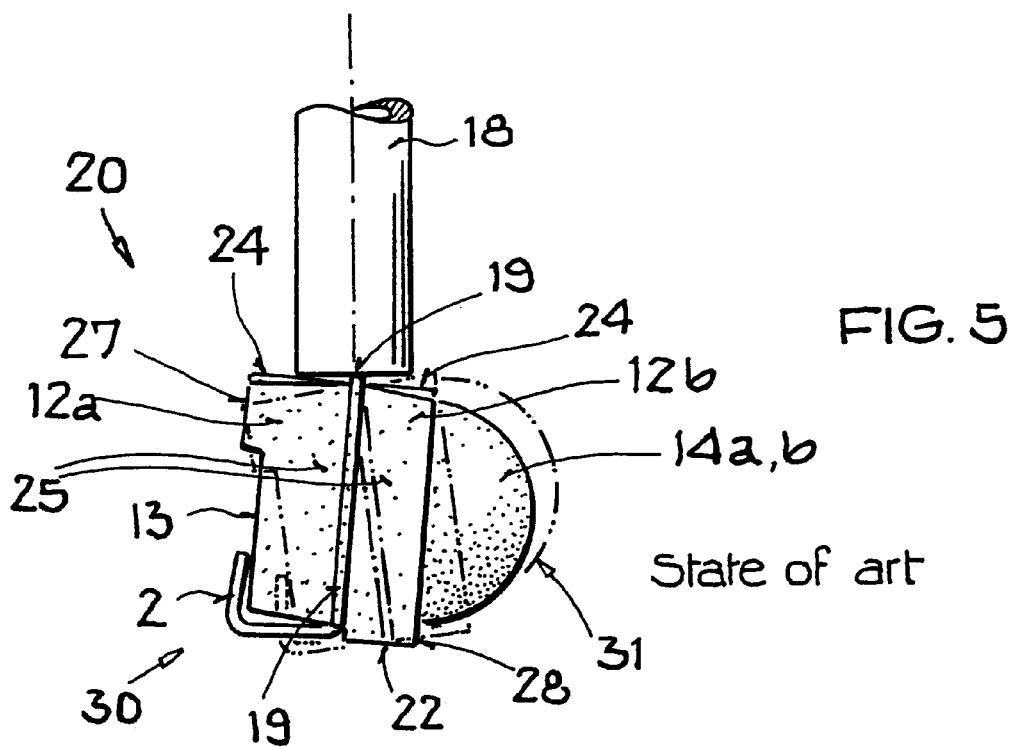
FIG. 5: a molded electronic component according to the state of the art.

Finally, FIG. 5 shows a molded electronic component 20 according to the state of the art. A ridge 19 on the side surface area 24 opposite to the connection pins 2, which is formed during molding in the separation surface area of the mold tool between the housing sections 12*a* and 12*b* in plane 26 of the connection pins 2, causes a distance to appear between the suction needle 18 and the housing 12, such that the component 20 is not held at all or with reduced force and in tilted fashion only. In an unacceptably large number of cases, this has the consequence that the component 20 assumes a tilted position on suction needle 18, for example one of the mis-positions 30 or 31 shown here, and is thus imprecisely positioned on the printed circuit board, necessitating manual and thus costly reworking. Furthermore, another consequence frequently is that the component 20 is not taken up or is lost during transportation.

The molded electronic component according to the invention can be taken up without difficulty by a tool (suction needle) and, for example, placed correctly onto a printed circuit board—without the component being taken up in a tilted fashion and thus incorrectly positioned on the printed circuit board or lost during transportation.

What is claimed is:

1. A molded electronic component with numerous connection pins protruding on a single plane from a side surface area of an essentially cuboid housing, with top and bottom sides, and a circumferential ridge along other side surface areas on the plane of the connection pins, the thickness of which ridge essentially corresponds to the thickness of the connection pins, wherein, on the other side surface area located opposite to the side surface area with the connection pins, the ridge passes into a groove in the plane of the connection pins.

2. The molded electronic component according to claim 1, wherein the component is a surface-mounting component.

3. The molded electronic component according to claim 2, wherein the connection pins are angled.

4. The molded electronic component according to claim 2, wherein the connection pins are each angled at two locations.

5. The molded electronic component according to claim 4, wherein, due to the angling of each of the connection pins at two locations, the component can be mounted onto a printed circuit board with said side surface area from which the connection pins protrude.

6. The molded electronic component according to claim 4, wherein the component is mounted with the bottom side thereof on a circuit board.

7. The molded electronic component according to claim 4, wherein the bottom side thereof features a recess for receiving the angled connection pins.

8. The molded electronic component according to claim 1, wherein the component features two lenses on the top side thereof.

9. A molded electronic component comprising:
   electronic circuitry;
   a housing of a molded material that encases said electronic circuitry and that has a top surface, a bottom surface, opposite first and second side surfaces, and opposite third and fourth side surfaces forming a primarily rectangular block shape; and
   plural electrical connection pins extending from said electronic circuitry out of said housing, outwardly from said first side surface along a single pin plane;
   wherein said housing further has a ridge of said molded material protruding outwardly from at least said third and fourth side surfaces along said pin plane, and a groove recessed inwardly into at least a portion of said second side surface along said pin plane.

10. The molded electronic component according to claim 9, wherein said housing further has two ridge portions of said molded material protruding outwardly from said second side surface respectively laterally adjacent to said groove along said pin plane, such that said ridge portions each transition into said groove.

11. The molded electronic component according to claim 9, wherein at least said portion of said second side surface having said groove therein is a flat planar continuous side surface except for said groove therein, and no part of said component protrudes outwardly from or beyond said flat planar continuous side surface on said portion of said second side surface.

12. The molded electronic component according to claim 9, wherein said ridge has a thickness in a direction perpendicular to said top and bottom surfaces that corresponds to a thickness of said pins in said direction.

13. The molded electronic component according to claim 9, wherein said pins are each respectively bent out of said pin plane at a first bend to extend along said first side surface away from said pin plane.

14. The molded electronic component according to claim 13, wherein said pins are each respectively additionally bent at a second bend to extend from said first side surface along said bottom surface toward said second side surface.

15. The molded electronic component according to claim 14, wherein said bottom surface has a recess therein, and portions of said pins extending from said second bends toward said second side surface are received at least partially in said recess in said bottom surface.

16. The molded electronic component according to claim 9, wherein said top surface includes a planar surface area and two lenses protruding from said planar surface area.

17. A combination of said molded electronic component according to claim 9, and a pick-up device comprising a suction needle that is arranged in contact with and suction-engages said second side surface at said portion thereof having said groove therein.

18. A combination of a frame and a molded electronic component, comprising:

electronic circuitry;

a housing of a molded material that encases said electronic circuitry and that has a top surface, a bottom surface, opposite first and second side surfaces, and opposite third and fourth side surfaces forming a primarily rectangular block shape; and plural electrical connection pins extending from said electronic circuitry out of said housing, outwardly from said first side surface alone a single pin plane;

wherein said housing further has a ridge of said molded material protruding outwardly from at least said third and fourth side surfaces along said pin plane, and a groove recessed inwardly into at least a portion of said second side surface along said pin plane;

wherein said frame is interconnected with said connection pins and extends around said first, second, third and fourth side surfaces; and wherein said frame is spaced away from said third and fourth side surfaces, said ridge protrudes outwardly to said frame at said third and fourth side surfaces, and said frame has at least a widened portion at said second side surface, whereby said widened portion protrudes into said groove in said second side surface of said housing.

\* \* \* \* \*